United States Patent
Becker et al.

(10) Patent No.: US 7,011,989 B2
(45) Date of Patent: Mar. 14, 2006

(54) METHOD FOR PRODUCING ENCAPSULATED CHIPS

(75) Inventors: Karl-Friedrich Becker, Berlin (DE); Tanja Braun, Berlin (DE); Mathias Koch, Berlin (DE); Andreas Ostmann, Berlin (DE); Lars Böttcher, Berlin (DE); Erik Jung, Falkensee (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 40 days.

(21) Appl. No.: 10/698,074

(22) Filed: Oct. 30, 2003

(65) Prior Publication Data

US 2004/0110323 A1 Jun. 10, 2004

(30) Foreign Application Priority Data

Oct. 30, 2002 (DE) .............................. 102 50 621

(51) Int. Cl.
*H01L 21/44* (2006.01)

(52) U.S. Cl. ..................................... 438/113; 438/127

(58) Field of Classification Search ........ 438/106–127, 438/612–617; 257/787–789, 778, 723, 795, 257/E21.502, E21.503, E21.504, E21.508
See application file for complete search history.

(56) References Cited

U.S. PATENT DOCUMENTS

| | | | |
|---|---|---|---|
| 3,579,056 A | 5/1971 | Te Velde | |
| 6,245,595 B1 | 6/2001 | Nguyen et al. | |
| 6,312,972 B1 | 11/2001 | Blackshear | |
| 6,329,220 B1 | 12/2001 | Bolken et al. | |
| 6,338,980 B1 | 1/2002 | Satoh | |
| 6,350,664 B1 | 2/2002 | Haji et al. | |
| 6,376,278 B1 | 4/2002 | Egawa et al. | |
| 6,441,500 B1 | 8/2002 | Sumikawa et al. | |
| 6,780,676 B1 * | 8/2004 | Igarashi et al. | 438/110 |
| 6,830,958 B1 * | 12/2004 | Makimoto | 438/110 |
| 2002/0123210 A1 * | 9/2002 | Liu | 438/459 |

FOREIGN PATENT DOCUMENTS

| | | |
|---|---|---|
| DE | 100 43 172 A1 | 5/2001 |
| DE | 101 37 184 A1 | 2/2003 |
| DE | 101 58 307 A1 | 2/2003 |
| EP | 1 035 572 A2 | 9/2000 |
| WO | 99/10926 | 3/1999 |
| WO | 02/13256 A1 | 2/2002 |

* cited by examiner

*Primary Examiner*—Brook Kebede
(74) *Attorney, Agent, or Firm*—Laurence A. Greenberg; Werner H. Stemer; Ralph E. Locher

(57) ABSTRACT

A method for producing encapsulated chips includes preparing a wafer with contacts projecting from a surface of the wafer. The wafer is disposed on a dicing substrate and diced into a plurality of spaced chips on the dicing substrate. The contacts are covered with a protection arrangement, then injection molding being conducted to introduce encapsulation material into the contacts and the trenches. Then the protection arrangement is removed so that the contacts are exposed.

19 Claims, 8 Drawing Sheets

METHOD FOR PRODUCING ENCAPSULATED CHIPS

BACKGROUND OF THE INVENTION

1. Field of the Invention

The present invention relates to the encapsulating of semiconductor structures and, in particular, to the producing of encapsulated chips.

2. Description of the Related Art

As it is known, for wafer-level encapsulation, methods are employed to mechanically stabilize wired integrated circuits, to protect the active structures and to achieve the easy construction of high bumps. In a commercially available implementation, with the increasing integration density and compactness of the semiconductor structures, it is being aimed at a wafer-level encapsulation of single integrated circuits with a fan-in redistribution in the range of mean contact distances greater than 400 $\mu$m.

FIG. 1 schematically shows depictions illustrating a method in which a wafer 10 with chips disposed thereon is first encapsulated and the encapsulated wafer 10 is then severed along separating lines 12 for producing diced chips 14. As can be seen, the thus obtained chip 14 has an encapsulation layer only on an upper main surface.

FIGS. 2a–c show schematic illustrations of a known chip 18 with a chip-size package. With reference to FIG. 2a, chip 18 has a passivation layer 20 on a main surface on which a copper fan-in redistribution structure 22 is formed. The redistribution structure 22 is connected to respective aluminum pads 26 disposed on edges 24 of chip 18.

The redistribution structure 22 further comprises post structures 28 projecting from the main surface of the chip and provided, on an upper surface, with solder bumps with a BGA pattern (BGA=ball-grid array) or a LGM pattern (LGA=land grid array). The post structures 28 are disposed in a cover layer 32 from a sealing material, e.g. a polymer or EPOXY material, to protect and mechanically stabilize them. FIG. 2b shows a top view onto chip 18 before encapsulation thereof, with the cover layer 32 not yet having been formed. Furthermore, FIG. 2c shows a top view onto the encapsulated chip 18, in which the post structures 28 extending through the cover layer 32 can be recognized in a regular grid arrangement.

It is disadvantageous about the prior-art procedures and methods that there is no possibility for the construction of a system in package in miniaturized implementation. In the prior art, it is also not provided to mount and then encapsulate different chips on wafer level.

The fan-in redistribution used in the prior art, in which outward-leading contacts are disposed, so that they are disposed within a chip footprint, may also lead, with high contact numbers, to an only very low relaxation or enlargement of the mean contact distance. Fan-in redistribution is therefore only partly suited for the requirements occurring with future integration densities.

Furthermore, with a further development in chip technology and a die-shrink resulting therefrom, it is required to change the arrangement of the contact pads, whereby users of such a member have to adapt circuit board layouts and loading processes to the respective members. This is connected with additional cost, and also prevents quick introduction in the market.

In the prior art, various encapsulation methods are used. For the encapsulation of a wafer, for example, it is known from U.S. Pat. No. 6,245,595 B1 to arrange a wafer in a bottom injection mold, a film being applied to the wafer in a coplanar manner to enable sealing the injection molding space. After the film has been brought into direct contact with solder bumps disposed on the wafer, a top injection molding part is pressed onto the film. Then an encapsulation material is injected into the formed cavity with pressure applied, so that an encapsulation layer forms between the wafer and the film, the solder bumps which are in direct contact with the film being substantially free of the encapsulation material on their upper portions. After the production of the encapsulation layer, the film is removed, whereupon the wafer with the encapsulation layer applied thereto is diced to produce separated chips.

This method has the disadvantage that, when creating an encapsulation layer on the entire wafer and subsequently dicing the wafer with the encapsulation layer, the diced chips units have an area that corresponds to the area of the chip. Accordingly, with such a method, no redistribution beyond the area of the semiconductor chip is possible. Furthermore, the method has the disadvantage that an encapsulation layer is only disposed on the main surface of the chips, with the side surfaces forming after the dicing not being encapsulated and therefore having a decreased mechanical protection.

Furthermore, a method is known from EP 1 035 572 A2, in which a resin material in powder or particle form is applied on a surface of a wafer with bumps. The wafer is placed in a cavity of a mold and then heated to melt the resin material. Then a top mold is pressed against a film applied on the bumps, whereby a resin layer forms between the film and the wafer.

Apart from the disadvantages already described above of encapsulating the entire wafer, this method also has the disadvantage of an expensive process sequence, in which first material is applied and then subjected to a melting procedure, wherein also mechanical actuation is required during molding. This results in high production costs and a low production rate for the method.

Another method for creating encapsulation layers is described in U.S. Pat. No. 6,338,980 B1. Prior to the resin sealing process, dicing of a wafer into semiconductor devices is conducted. After conducting the dicing process, the diced chips are arranged on a base member and then subjected to a resin sealing process, wherein the semiconductor devices are applied and mounted to a base support. Then a resin compression molding process is conducted to create a resin layer on the surface of the semiconductor devices and a resin layer between the devices.

In the above method, wherein the chips are diced prior to encapsulation and then arranged on a base support for encapsulation, however, additional steps and devices, such as a chip support or chuck for mounting the chips and transporting them to the base support, are required. Thereby, the expenses in the production thereof increase, so that production costs increase. Furthermore, the use of a resin compression molding process is also disadvantageous for some applications.

Another disadvantage of the prior art is that the integration of functional structures on the encapsulation level is not provided. For example, in the prior art, the shaping of raised contact pads or the creation of geometric structures for assembly assistance, e.g. V-notches, is only achieved by additional material treatment or by additional steps.

It is the object of the present invention to provide a method which enables inexpensive encapsulating of chips with a concurrent, high production rate.

SUMMARY OF THE INVENTION

The present invention is a method for producing encapsulated chips comprising the steps of preparing a wafer with contacts projecting from a surface of the wafer, arranging the wafer on a dicing substrate, dicing the wafer to generate a plurality of chips spaced from ach other via trenches on the dicing substrate conducting injection molding to introduce an encapsulation material between the contacts and into the trenches, whereby the chips arranged on the dicing substrate are encapsulated and creating a redistribution structure of an electrically conductive material on a portion formed by the encapsulation material.

Furthermore, the present invention is a method of producing a stack of encapsulated chips, comprising the steps of producing first encapsulated chips by preparing a first wafer with contacts projecting from a surface of the first wafer, arranging the first wafer on a dicing substrate, dicing the first wafer to generate a plurality of chips spaced from each other via trenches on the dicing substrate conducting injection molding to introduce an encapsulation material between the contacts and into the trenches, whereby the chips arranged on the dicing substrate are encapsulated and creating a redistribution structure of an electrically conductive material on a portion formed by the encapsulation material and producing second encapsulated chips by preparing a second wafer with contacts projecting from a surface of the second wafer, arranging the second wafer on a dicing substrate, dicing the second wafer to generate a plurality of chips spaced from ach other via trenches on the dicing substrate conducting injection molding to introduce an encapsulation material between the contacts and into the trenches, whereby the chips arranged on the dicing substrate are encapsulated and creating a redistribution structure of an electrically conductive, and arranging the first encapsulated chips above the second encapsulated chips so that a stack of encapsulated chips is formed.

The present invention is based on the finding that enhanced redistribution may be achieved by dicing a wafer prior to the encapsulation and then subjecting the diced chips to injection molding. According to the invention, the wafer is disposed on the dicing substrate, so that the chips remain disposed on the dicing substrate both after dicing and during injection molding. With the inventive method, by the dicing of the chips prior to the encapsulation, the trenches between the chips are enabled to be filled with encapsulation material. Thereby, it may be achieved that an area of the chip unit formed after encapsulating, which includes the chip as well as a laterally disposed encapsulation mass, is larger than an area of the chip itself, so that an increased area is available for the encapsulated chip unit as compared to the chip. The extension of the existing area enables a redistribution of molded or encapsulated integrated circuits for the attainment of increased mean contact distances. The redistribution takes place in an inexpensive manner, since the additional area is provided by the cheap encapsulation material.

The redistribution created on the encapsulation mass may be a structured, thinly formed contact pad, for example, which is applied on the encapsulation mass for creating conductive layers by means of known methods. The redistribution structure may also extend across areas of the diced chip.

With the inventive method, also simplified handling with a high production rate is achieved, since the time-consuming arranging and transporting of diced chips is avoided by the wafer remaining arranged on the dicing substrate after dicing and during injection molding.

By using an injection molding method, the encapsulation method has reduced production costs with concurrent guarantee of a high production rate. For conducting, the injection molding method only requires the arranging of the chips and an injection molding part and then introducing the encapsulation material. Thereby, it has a high degree of automation and is particularly suited for methods in which a high production rate is required. Furthermore, the injection molding enables a concurrent shaping of functional structures of the encapsulated chips, so that they can be created in a simple and inexpensive way.

In one embodiment, in which the dicing substrate is formed out of deformable material, such as a deformable film, also the spacing of the chips from each other is increased after dicing by subjecting the elastic dicing substrate to mechanical treatment for the enlargement of the area, such as a stretching of the dicing substrate.

By the mechanical treatment, the area of the dicing substrate on which the chips are arranged increases, so that the chips are spaced from each other over a greater gap on the dicing substrate. Thereby, the area of a chip unit may easily be increased after encapsulating and adjusted to a predetermined value.

Preferably, the spacing is equally increased in all directions. By a selective mechanical treatment, however, i.e. for example stretching the dicing substrate only along predetermined directions, selective increasing of the chip distances in the respective directions may be achieved, so that not only the area of an encapsulated chip unit, but also the respective width and length are adjustable. This is particularly advantageous, when an additional area for a fan-out redistribution is only required for contacts along certain edges of the chip.

By severing along the encapsulated trenches, the encapsulated chip units may be diced after encapsulating, this preferably taking place with a thin kerf width to keep an area loss low. Thereby, a diced chip unit formed after severing the encapsulated trenches may include both the chip disposed on the semiconductor substrate and an encapsulation mass laterally disposed on the chip, which provides the additional area for redistribution.

The chip units formed after dicing thus enable the fan-out redistribution in which the contacts may be distributed on the area additionally made available by the encapsulation mass.

According to one embodiment of the present invention, it is provided to create functional structures and/or microstructures in the encapsulation material when injection molding. Such functional structures may exemplarily include a recess, a V-notch, an protrusion, or a bump. The functional structures may be intended for arranging an optical guide as adjustment markings or for assembly assistance.

Furthermore, in injection molding, a pass-through conductor may be created in the encapsulation mass introduced into the trenches, such as by arranging an electrically conductive structure, such as an electrically conductive pin, in a trench formed between the chips prior to introducing the encapsulation material.

By introducing wires or pass-through conductors, 3D constructions may be realized, which allow a space-saving solution for the construction of multi-component systems. For example, the pass-through conductor may be used to enable an integrated via in a creation of a stackable system. The creation of the functional structures during the injection molding enables an even further simplification of a production of encapsulated chips in which such structures are required. For example, in one embodiment, the assembly of mechanical or optical functional units is facilitated by introduced microstructures in the encapsulation level. An optimized optical guide fiber adjustment may be achieved, for example, by direct realization of a V-notch in the encapsulation process or the geometric shaping of contact bumps which may be used for contacting the member by metalization and structurization of a redistribution layer.

According to the invention, by injection molding or an injection pressing process, dynamic introduction or injection of material into a cavity is to be understood, which includes the diced chips, which may take place by means of an overpressure, for example. The cavity is formed, for example, between the protection arrangement covering the one surface of the projecting contacts and an injection mold into which the chips arranged on the dicing substrate are introduced. In the injection molding method, the material for encapsulation is injected preferably in liquid form, the temperature of the encapsulation material being increased as opposed to an ambient temperature.

In one embodiment, the protection arrangement may be a film extending over the entire chips. Through the film, it is possible to provide both a sealing of the cavity and a coverage of the contacts for keeping them free. In one embodiment, the injection mold may have a counter structure which is applied on the film. The counter structure may itself be the protection arrangement, wherein it may have an integrated sealing area for covering the contacts. The counter structure may be pressed against the projecting contacts under continuous application of pressure, so that they are tightly terminated with the protection arrangement.

In one embodiment, the protection contact may also be made by coating the surface of the contacts with a material that may be delaminated from the contacts without destruction of the chip unit after conducting the injection molding. To this end, the wafer may be dipped into liquid with the wafer surface, which comprises the delaminable material, so that, after drying or curing, a layer of the delaminable material forms on the surface of the contacts.

Preferably, the injection molding is conducted such that the surface of the encapsulation material is planar with the surface of the projecting contacts. This enables that, in a subsequent redistribution, a planarizing of the surface is not required, so that the redistribution structure may be directly applied on the encapsulation material and the surface of the contacts as a thin layer. Furthermore, stacking of several encapsulated chips on top of each other is facilitated by creating a planar surface.

BRIEF DESCRIPTION OF THE DRAWINGS

These and other objects and features of the present invention will become clear from the following description taken in conjunction with the accompanying drawings, in which.

DESCRIPTION OF THE PREFFERED EMBODIMENTS

Figure 1:
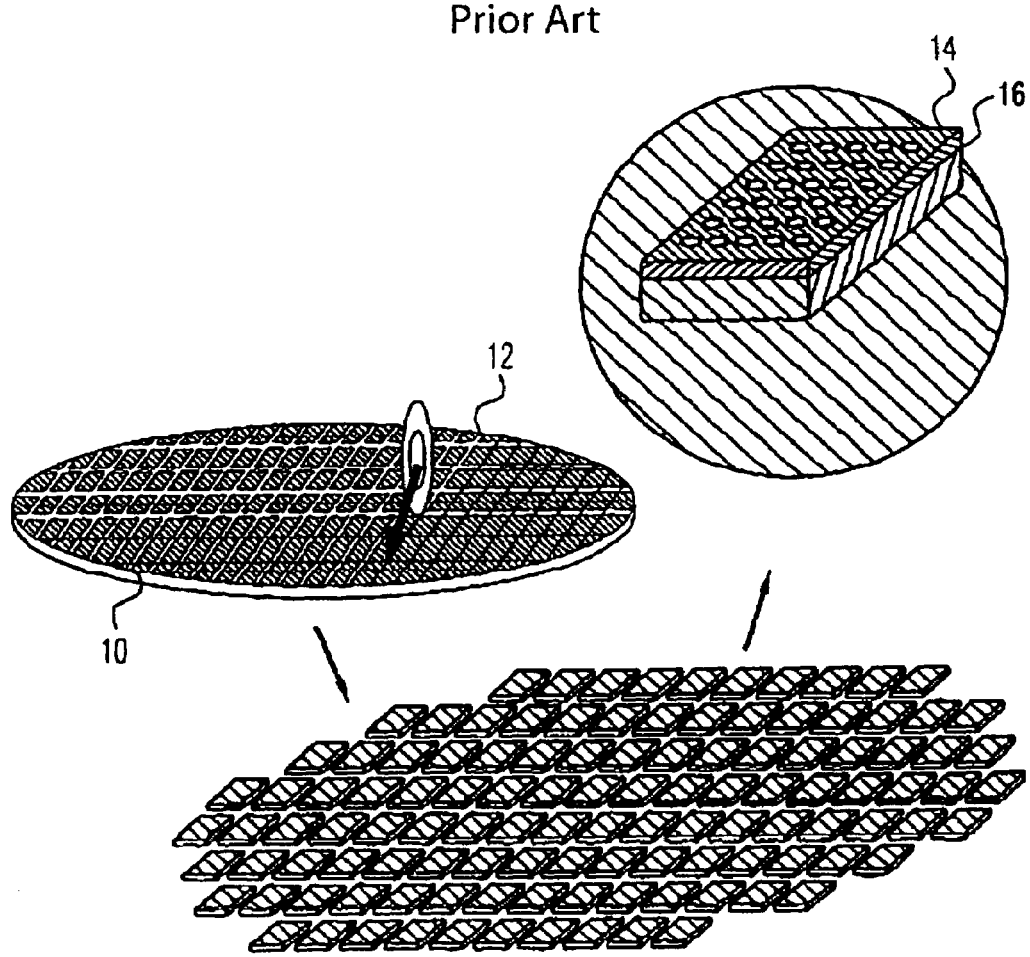
FIG. 1 is a schematic illustrations of a prior-art encapsulation method.
Figure 2A:
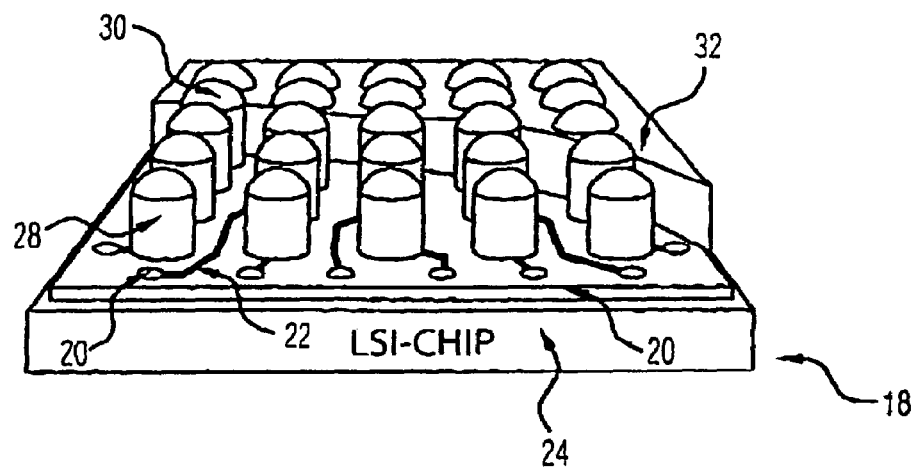
FIGS. 2a–2c are schematic illustrations of a prior-art chip arrangement with a redistribution structure.
Figure 2B:
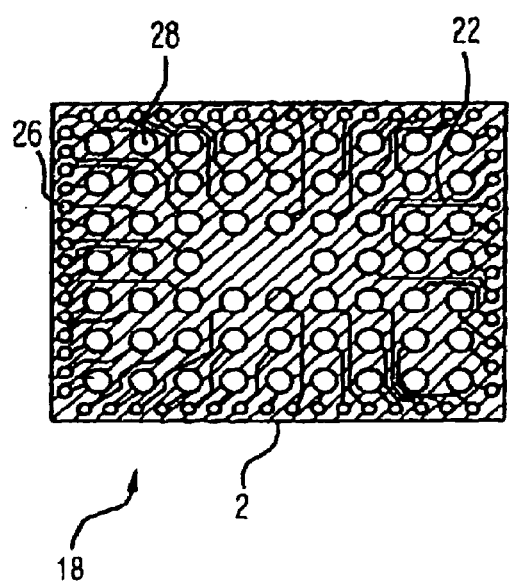
Figure 2C:
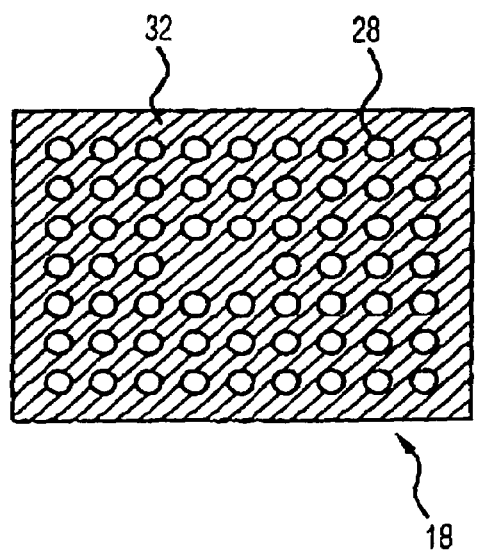
Figure 3A:
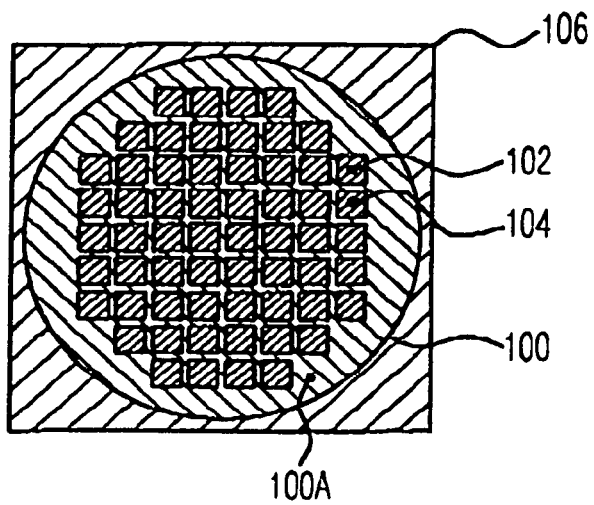
FIGS. 3a–3c are schematic top views of a wafer for the illustration of wafer dicing according to one embodiment of the present invention.
Figure 3B:
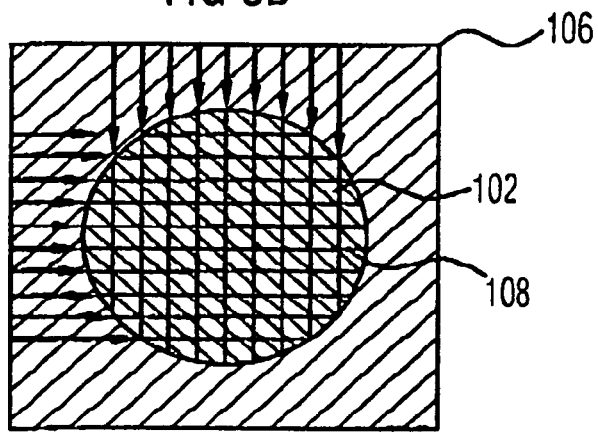
Figure 3C:
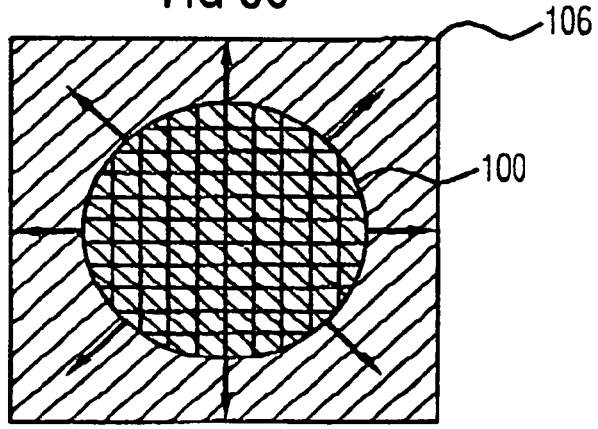

In the following, with reference to FIGS. 3a–c and FIGS. 4a–f, a first embodiment of a single-stage wafer-level encapsulation according to the present invention is explained, which also allows to process hybrid systems constructed on wafer level, which may include different chip types, mechanical functional units, MEMS, or MOEMS. FIGS. 3a–c show various phases during dicing a wafer 100, and FIGS. 4a–f show various phases during encapsulation by means of injection molding. In the various figures of the following embodiments, similar elements are provided with similar reference numerals, respectively.

FIG. 3a shows a wafer 100 that has been prepared so that it includes a plurality of chips 102. The chips 102 include functional units, such as integrated circuits, sensors or sensor structures, mechanical or optical functional units, such as MEMS (micro-electromechanical systems) or MOEMS (micro-optical-electromechanical structures), which are arranged on a surface 100a, for example. In one embodiment, a three-dimensional stack is prepared in which two or more chips are stacked on top of each other. To this end, in addition to wafer 100, another wafer may be prepared which, for example, comprises a plurality of chips with functional units associated with the respective chips of wafer 100. The stack may be encapsulated corresponding to the way described in the following for a single wafer.

In other words, a microelectronic member is produced from one functional unit or by wafer-level combination of two or more functional units, the assembled functional units resulting in a "system". By the use of thin functional units and the redistribution technology, this system may typically lie in the thickness range of a wafer.

Preferably, the wafer comprises a semiconductor material, such as silicon or GaAs, and may include any shape or diameter. In one embodiment, the wafer includes a thinned wafer, wherein it may have a diameter smaller than 100 $\mu$m.

On wafer 100, contacts 104 are arranged which project from the wafer surface 100a. Contacts 104 are connected to the respective electrical terminals of the functional unit arranged on chip 102, such as via pads laterally arranged to the chip.

Contacts 104 may for example include a bump, which may be formed from copper, or a solder bump. For example, for the formation of the contacts 104, contacts may be outwardly provided on wafer level with a solderable metalization and a bump out of Cu or a solder bump, such as out of eutectic PbSn or SnAg. The solderable metalization may for example be created in an electroless Ni-process. A typical value of the height of the contacts above the wafer surface 100a lies between 50 and 200 µm, for example at 100 µm.

In a next step, the wafer is applied to a dicing substrate. The dicing substrate enables the separated chips, in the following dicing of the wafer into the chips, to be held, in the subsequent encapsulating of the chips, in a pattern in which they are spaced from each other.

The wafer may for example be mounted on the dicing substrate 106 with reversible adhesive. This enables delaminating the dicing substrate after encapsulation when it is not desired that the dicing substrate remain on the chips. Preferably, the dicing substrate is formed out of a deformable or elastic material, and for example comprises the form of a film, e.g. out of plastic.

After wafer 100 is mounted on the dicing substrate 106, wafer 100 is diced into the individual chips 102, so that the separated chips are opposing each other via the dicing trenches 108 formed in dicing, as it is shown in FIG. 3b. The dicing may for example take place by sawing the wafer along pre-determined separation lines, wherein the sawing procedure only severs wafer 100, so that the dicing substrate is not completely severed. Furthermore, the dicing may also include etching the wafer along the predetermined separation lines. The spacing of the chips via the separating trenches may be adjusted to a predetermined value, such as by the selection of the thickness of a saw blade or suitable structure of an etching mask.

The arrangement of the separated chips is held by the dicing substrate 106 after dicing, wherein they are spaced from each other via the separating trenches, as mentioned above.

As illustrated in FIG. 3c, in a particularly preferred embodiment, the dicing trenches 108 formed in dicing may be enlarged by enlarging the area of the dicing substrate, so that the chips are spaced further apart from each other, compared to the distance resulting after dicing. This may be done, for example, by use of deformable film as dicing substrate 106 and stretching thereof.

Accordingly, the circumference and the diameter of the entirety of the diced chips after enlarging the separating distances have a higher value as compared with the circumference or diameter of the original wafer. This has to be taken into account, in particular, in the following arranging the chips in an injection mold, since the arrangement of the chips with enlarged separating distances may require a dimensioning of the injection mold which is different from the one resulting in known injection molds for respective wafers.

Furthermore, in one embodiment, an enlargement of the separating distances of the chips may be achieved by heating the dicing substrate, wherein the dicing substrate may additionally be stretched, as described above.

Preferably, the stretching of the dicing substrate with the spread-out wafer 100 takes place equally in all spatial directions, so that equal gaps form between the separated chips. Alternatively, selective stretching of the dicing substrate in predetermined directions may also take place.

By stretching the support film of the sawn and spread-out wafer, it is possible to redistribute the contact of the embedded chips onto the area outside the chip area after the encapsulation. This may for example enable compensation of the reduction in area after the die shrink and thus the maintenance of the former contact layout. Furthermore, as another possibility, finest mean contact distances may be relaxed by redistribution to areas inside and outside of the chip footprint, and thus enable the use of a cheaper substrate material or allow it at all in the first place.

After dicing, the wafer is put into an injection mold, the wafer remaining arranged on the dicing substrate. The injection mold is preferably formed so that a planar sample may be provided with an encapsulation layer. Furthermore, it may also enable the exposing of the contacts, as it is subsequently described in greater detail. Furthermore, in the upper half of injection mold, structures may be introduced, which are transferred by the encapsulation process to the wafer surface, and enable or facilitate the assembly of micro-systems, as is described in greater detail in the following with reference to FIGS. 9–11b.

Furthermore, in one embodiment, it may be provided that the dicing substrate is introduced into the injection mold with the diced wafer, whereupon enlarging of the separating distances between the chips is conducted in the injection mold. The dicing substrate may for example be arranged in the injection mold, then be stretched by uniform pulling at its edges, wherein the stretched dicing substrate is then fixed for maintaining the stretched shape, such as by attaching two portions of the injection mold.

For keeping the contacts 104 free, the arrangement of chips 102 is covered with a protection arrangement so that, in a following introduction of encapsulation material, the surfaces of the contacts 104 do not come into contact with the encapsulation material. The protection arrangement may, for example, be a film from a delaminable material, which is laid over the contacts 102. Furthermore, the protection arrangement may be formed by a portion of the injection mold brought into contact with the contact 102. The portion brought into contact with the contacts may also have an integrated sealing area so that, by the pressing of the portion of the injection mold, which may for example be an upper half of a mold, against a main portion, sealing of the injection molding cavity and concurrently covering of the contacts 104 is achieved. Furthermore, the protection arrangement for covering the contacts may include a layer from a delaminable material, which is formed on the surfaces of the contacts. For example, this may be achieved by dipping the wafer into a liquid having a delaminable material so that, after drying or curing, the layer from the delaminable material is formed on the surfaces of the contacts.

Figure 4A:
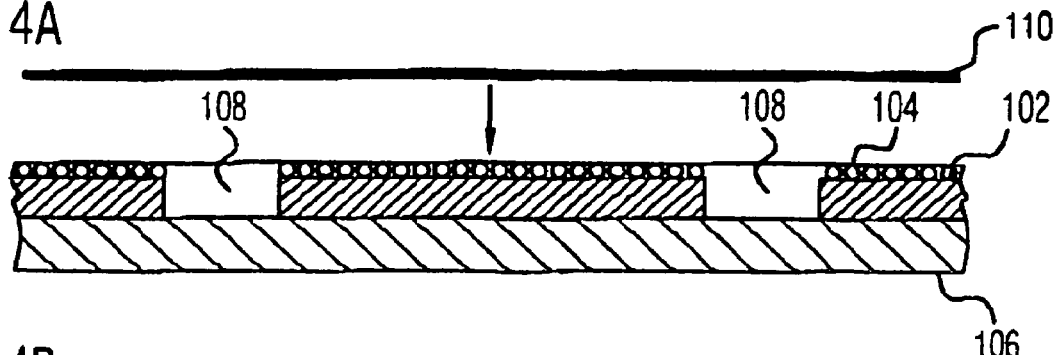
FIGS. 4a–4f are schematic cross-sectional views showing various phases in encapsulation according to one embodiment of the present invention.

FIG. 4a shows a schematic view of wafer 100 diced into the chips 102, prior to applying the protection arrangement 110.

After the diced wafer with the dicing substrate is arranged in the injection mold, the injection mold is closed to obtain a sealed cavity. In this embodiment, the cavity is limited by the protection arrangement and the injection mold. For sealing the cavity, an upper portion of the cover of the injection mold may be pressed onto the protection arrangement, wherein the protection arrangement is arranged between the upper portion and the main portion of the injection mold.

Figure 4B:
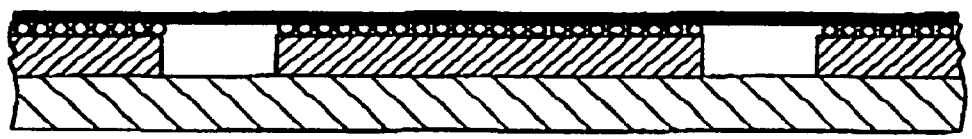

FIG. 4b shows the arrangement of FIG. 4a, after the protection arrangement 110 covers the contacts 104. As can be seen, the chips 102 are arranged on the dicing substrate 106 and spaced from each other via trenches 108. Furthermore, in one embodiment, drawing of a vacuum is provided to achieve improved mold filling performance.

Figure 4C:
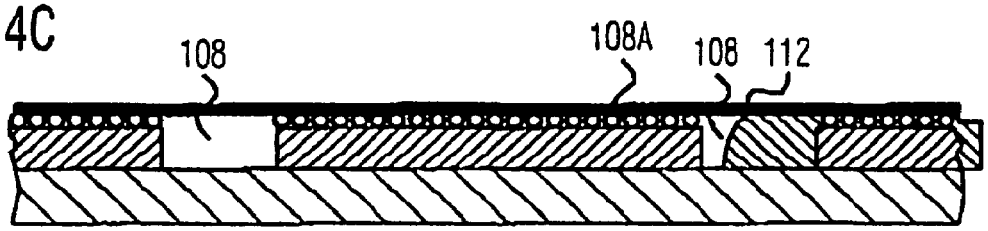

In injection molding, the area of the trenches and the area between the contacts 104 are filled with encapsulation material 112 by introducing it into the injection molding cavity. According to FIG. 4c showing the arrangement of FIG. 4b during a first phase of the injection molding, in the embodiment shown, the encapsulation material is laterally injected into the cavity formed between the protection arrangement 110 and the dicing substrate 106. Thereby the trenches 108 as well as areas 108a between the contacts 104 are filled with the encapsulation material 112 from the side.

Figure 4D:
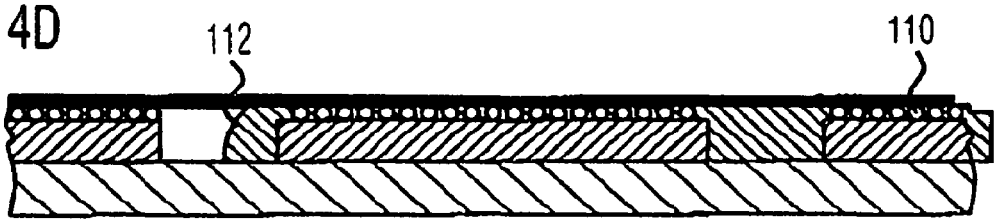

FIG. 4d shows the arrangement of FIG. 4c at a later point of time of the injection molding process in which a trench is already completely filled with the encapsulation material 112 by the lateral injection, and another trench 108 is being filled up with the encapsulation material.

Figure 4E:
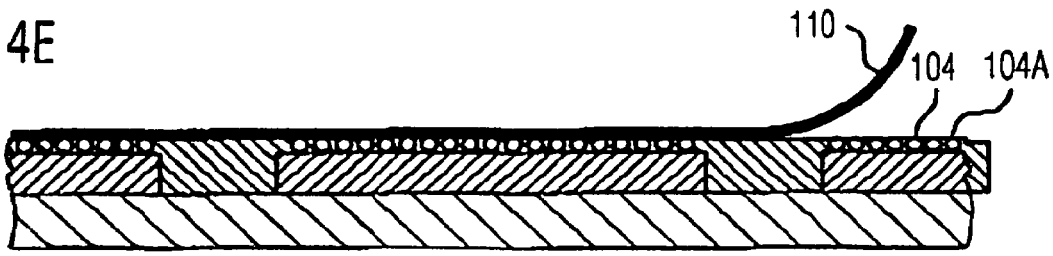
Figure 4F:
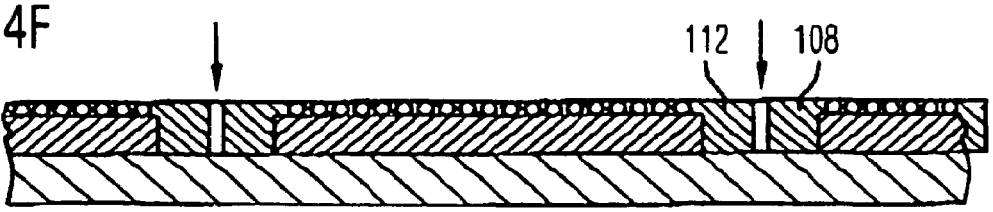

After the entire gap between the protection arrangement 110 and the trenches 108 is filled with the encapsulation material in injection molding, the protection arrangement 110 is removed, so that the contacts 104 on the surface 104a which is in contact with the protection arrangement 110 during injection molding are exposed. To this end, the injection mold is opened and the wafer is removed. FIG. 4e shows the arrangement of FIG. 4d when removing the protection arrangement 110. For example, the removal may take place, such that the protection arrangement is successively removed, i.e. for example by peeling off from the surface formed by the encapsulation mass 112 and the bumps. Preferably, the protection arrangement 110 is removed in a mechanical way, wherein, however, chemical removal may also be provided, for example by etching or dissolving the protection arrangement 110.

The direct encapsulation, which can be achieved with the method, of functional units fixed in the encapsulation mold or the system constructed from functional units without additional circuit supports enables the protection of the internal contacting and possible existing additional units with respect to mechanical and chemical stress. Furthermore, the solder contacts are also mechanically stabilized so that they have an increased reliability.

After the protection arrangement 110 is removed, the surface of the encapsulation material 112 is substantially planar with the surface 104a of the contacts 104, whereby applying of contacts, for example of redistribution contacts in a subsequent redistribution, is possible without additional planarization steps. In one embodiment, the encapsulated arrangement of chips is provided with redistribution structures, and the exposed upper side 104a of contacts 104 is contacted on the wafer level. This may take place, for example, by printing, full-area metalizing or laser structuring.

In one embodiment, the redistribution contact is applied on the redistribution structure, which projects from the redistribution structure. The area between the redistribution contacts may be filled with electrically insulating material to achieve mechanical stabilization and insulation. Preferably, this may also take place by means of injection molding, whereby the providing of additional devices is limited.

After encapsulating and removing the protection arrangement 110, the chips 102, together with the encapsulation material 112, form a mechanically combined unit. For the production of individual chip units, the chips may also be diced by severing, e.g. by means of sawing, the encapsulation mass 112 along the trenches 108, as it is shown with reference to FIG. 4f. Furthermore, the diced chip units may be delaminated from the dicing substrate 106.

Alternatively, the chips may also be diced without removing the dicing substrate 106. To this end, in addition to the encapsulation mass 112, the dicing substrate 106 is severed along the trenches.

Figure 5:
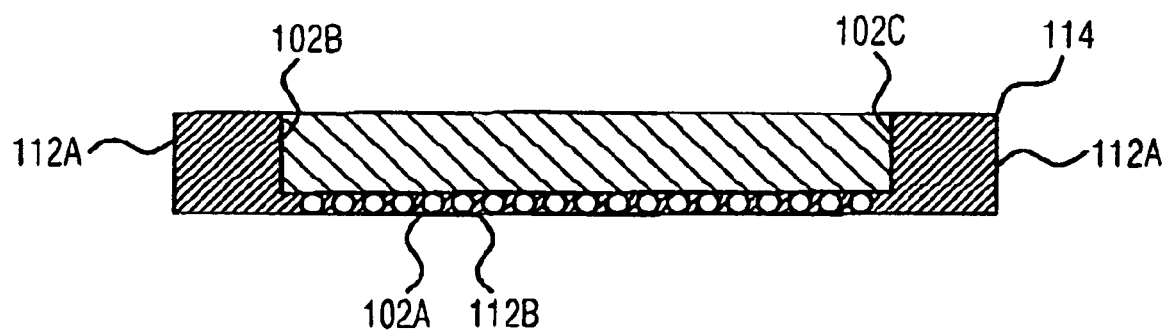
FIGS. 5–7 are schematic cross-sectional views of encapsulated chips produced according to embodiments of the present invention.

FIG. 5 shows a package created by the above-described wafer injection molding process for substrate assembly. The package or encapsulated chip unit comprises, after encapsulation on lateral surfaces 102b and 102c of chip 102, an encapsulation mass portion 112a and on one main surface 102a an encapsulation mass portion 112b, so that chip 102 has an increased mechanical stability and protection effect as opposed to a chip that does not have lateral encapsulation. A substantial advantage of the described method is also that, by the lateral encapsulation portions 112a, the chip unit formed after encapsulating has a larger area than that of chip 102 by itself. For example, this enables that, with die-shrink, the compensation of the reduction in area of the chip contingent on the chip miniaturization may be conducted. Thereby, former contact layouts may be maintained, whereby for example matching of holding or support devices to the shrunk dimensions of the chips is not required. Thereby, it is possible to conduct a chip area reduction with low expenses, i.e. for example without matching of equipment, whereby costs are kept low. Furthermore, by providing an enlarged surface, in particular applications, it actually becomes possible to conduct a mounting of the diced chip unit. Particular holding or handling devices often require a minimum size of the chips which cannot be decreased so that, only by the inventive encapsulating, handling of miniaturized chips is achieved in these cases.

By the described method, it is also possible to relax finest mean contact distances to larger mean contact distances by a redistribution onto areas within the chip footprint, i.e. by fan-in redistribution, and outside the chip footprint, i.e. by fan-out redistribution. This enables the use of the cheaper substrate material, since the enlarged surface is provided by a cheap encapsulation material and not by the expensive semiconductor material.

In the following, with reference to FIGS. 6–13, further embodiments of the present invention will be explained.

Figure 6:
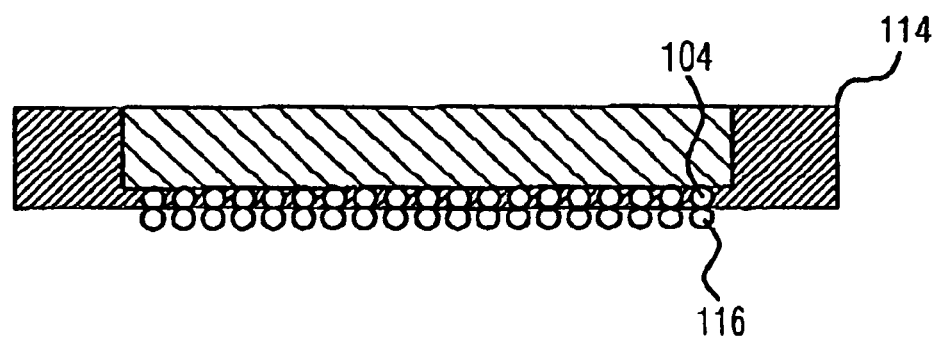

According to FIG. 6, in one embodiment, direct electrical contacting of contacts 104 is conducted by means of contact structures 116, which are associated with the contacts 104, respectively. The contact structure 116 may, for example, be an arrangement of bumps arranged on a connection substrate and brought into contact with the associated contacts 104. To this end, a flip-chip technique is employed, for example.

Figure 7:
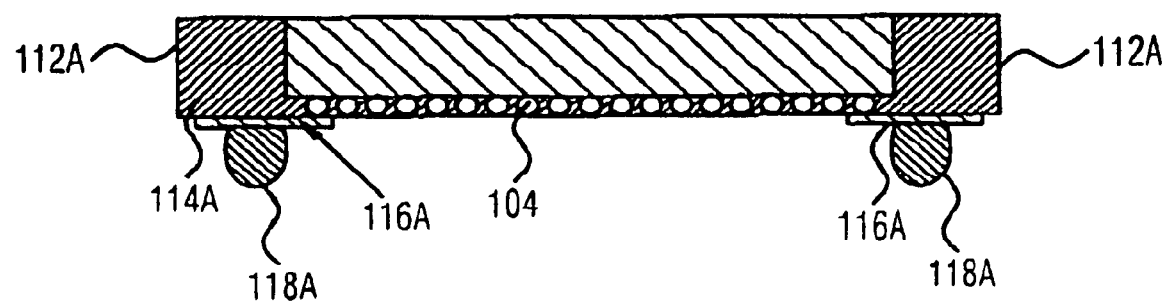

FIG. 7 shows an embodiment in which fan-out redistribution is being conducted. In this embodiment, the redistribution structure 116a is applied on a surface 114a of a chip unit 114 so that it has an electric contact with one or more of the bumps 104. The redistribution structure 116a may for example be formed by the structured redistribution layer formed by means of known structuring processes. Then, a redistribution contact 118a, which may be a metal contact bump, is applied to the redistribution structure 116a. For enabling the fan-out redistribution, the redistribution structure 116a extends on the surface of the lateral encapsulation mass portions 112a so that the redistribution contact 118a may be disposed outside the chip area. Preferably, the redistribution of the encapsulated chips takes place after removing the protection arrangement 110 and before dicing the encapsulated chips combined to a unit. Thereby redistribution for the entire chips may take place in parallel, i.e. the redistribution structure 116a and the redistribution contacts 118a can be created for all chips formed from a wafer at the same time.

In the following, with reference to FIGS. 8–10, 11a and 11b, further embodiments of the present invention will be explained.

Figure 8:
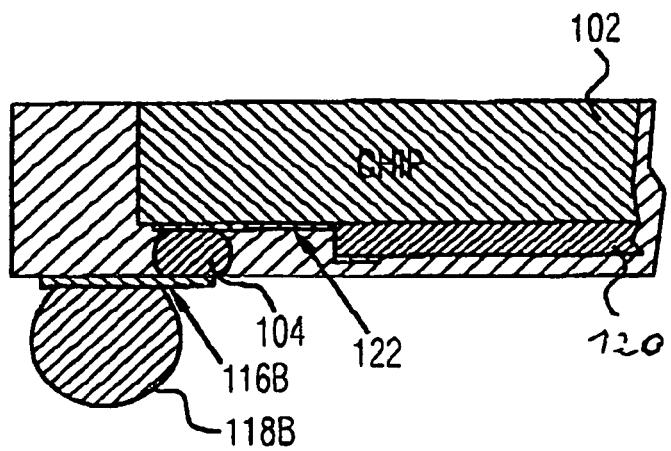
FIGS. 8–10 are schematic cross-sectional views of encapsulated chips according to embodiments of the present invention.

FIG. 8 shows an embodiment in which chip 102 comprises another functional unit 120 mounted on a surface 102a of chip 102. In this embodiment, wafer 100 is prepared such that functional units 120 are mounted above the respective associated chip areas. Accordingly, in this embodiment, instead of a wafer with a functional unit, a combination of several functional units on wafer level is encapsulated for the production of a micro-electronic member.

As can also be seen in FIG. 8, redistribution is conducted in which the functional unit 120 is connected via a pad 122 partly extending on chip 102 and functional unit 120. Contact 104 is redistributed onto an area outside the chip by means of a redistribution structure 116b and a redistribution contact 118b.

With reference to FIGS. 9, 10, 11a and 11b, further embodiments are explained in the following, in which functional elements or microstructures are formed during injection molding. Functional structures, such as protecting contact areas or geometric structures for assembly assistance, are required with many applications of encapsulated chips, with an integration of such ones of the functional structures on the encapsulation level not being provided in the prior art. As it is known, the design of such functional structures is only achieved by additional material treatment or by additional steps, such as mechanical treatment or etching with an applied mask.

Figure 9:
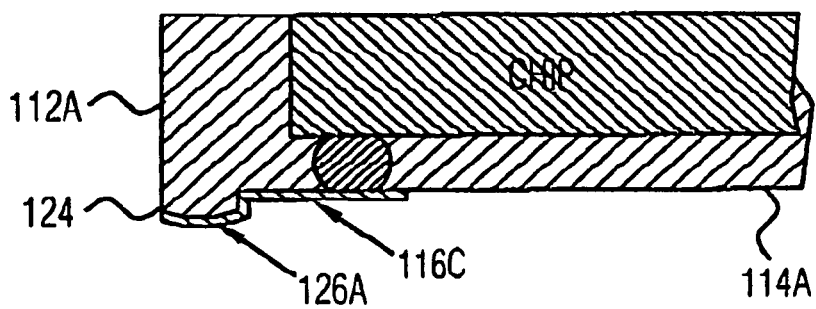

FIG. 9 shows an embodiment of the present invention in which the lateral encapsulation mass portion 112a is shaped by injection molding, such that on the main surface 114a of the chip unit a bump-shaped protrusion is formed which projects from a surface of the encapsulation material. In this embodiment, an electrically conductive layer 126a is formed on the bump. The electrically conductive layer 126a is also electrically connected with contact 104, for example via a redistribution structure 116c, whereby bump 124 may provide an electric connection for the chip by connecting to an associated terminal. Thereby, a redistribution may be achieved in a simple and inexpensive way, since, with the redistribution contact, a more expensive metal is only required for forming the thin, electrically conductive layer 126a, it being otherwise formed, apart from that, from the inexpensive encapsulation material and also without additional steps.

The forming of the functional elements is achieved, such that the injection mold has a shape formed corresponding to the functional elements. Furthermore, the shaping of the functional elements may also take place by inserting correspondingly shaped elements into the injection molding cavity so that only few adjustments of known injection molds are required.

Figure 10:
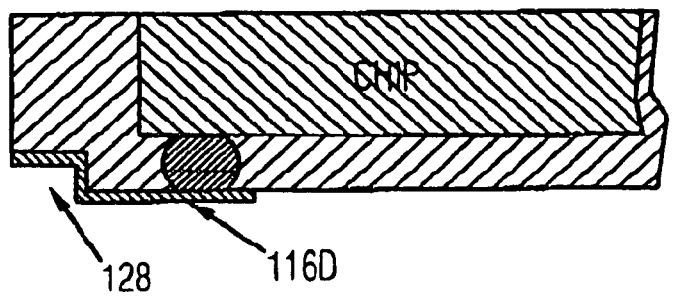

FIG. 10 shows another embodiment in which a recess 128 is formed in the lateral encapsulation mass portion 112a.

The recess shown in FIG. 10 is formed, such that after separating the encapsulating chips a laterally disposed stair-shape edge is formed. Furthermore, the recess 128 may be coated with a conductive layer 128, as it is shown in FIG. 10, whereby it may serve as the contact area for a redistribution contact so that for example the redistribution contact may be applied in an exactly predetermined position. The conductive layer 126b comprises a contact with a redistribution structure 116d arranged on the main surface 114a of the chip unit, so that an electric terminal for chip 102 is provided via the conductive layer 128. The recess 128 created by the injection molding process may further represent an adjustment aid, for example, such as to facilitate adjustment when stacking chip units. Furthermore, the recess may also serve for the assistance of an assembly of further chip units.

Figure 11A:
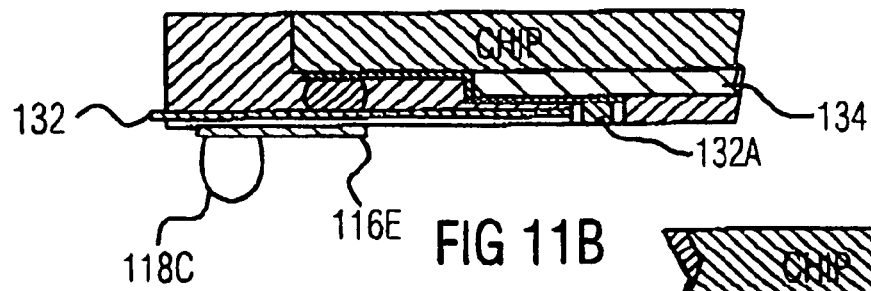
FIGS. 11a–11b are cross-sectional views according to one embodiment of the present invention.
Figure 11B:
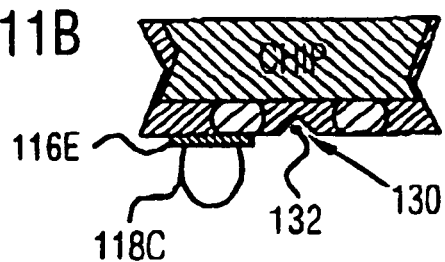

With reference to FIGS. 11a and 11b, an embodiment will be described in the following, in which the functional element for adjusting and arranging an optical guide fiber is created by injection molding. According to FIG. 11b, the functional element includes a V-notch 130, which is formed in the encapsulation mass portion 112b formed in the encapsulation material 112 by injection molding, and also extends into the lateral encapsulation mass portion 112a.

For example, the V-notch enables the optical guide fiber 132 to be arranged therein, preferably without the optical guide fiber 132 extending across the main surface of the unit. FIG. 11b shows a cross-section through the encapsulated chip unit transversely to the optical guide fiber 132, while FIG. 11a shows a cross-section through the encapsulated chip element along the optical guide fiber 132. Furthermore, in this embodiment, a launching element is formed in the encapsulation mass portion 112b to enable coupling of light transmitted via optical guide fiber 132 to functional element 134 arranged on chip 102. For example, the launching element is a mirror obliquely disposed with respect to the incident light axis, wherein the mirror may be created by injection molding and then be provided with a reflective layer. According to the above-described embodiments, in this embodiment, redistribution by means of a redistribution structure 116e and a redistribution contact 116c disposed thereon is also provided.

Figure 12A:
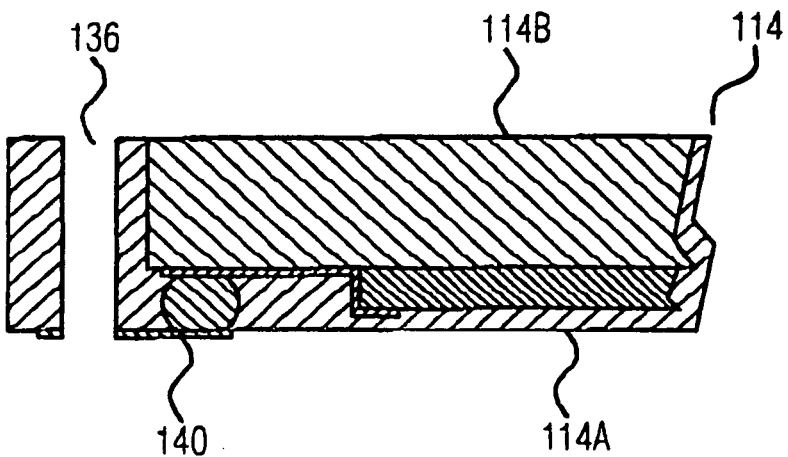
FIGS. 12a–12d are cross-sectional views of an encapsulated chip showing various phases in a creation of vias according to one embodiment of the present invention.

With reference to FIGS. 12a–12, another embodiment of the present invention will be explained. In this embodiment, a via is created in the encapsulation material, which extends from the main surface 114a of the chip element 114 to an opposing main surface 114b of the encapsulation chip element 114. According to FIG. 12a, to this end, a recess 136 is created in the encapsulation material 112, which extends from the main surface 114a to the main surface 114b. The creation of the recess 136 may take place after injection molding, such as by means of mechanical removal of material or chemical removal. Alternatively, the recess 136 may be created by injection molding by suitable shaping elements being arranged in the injection mold for keeping free.

Figure 12B:
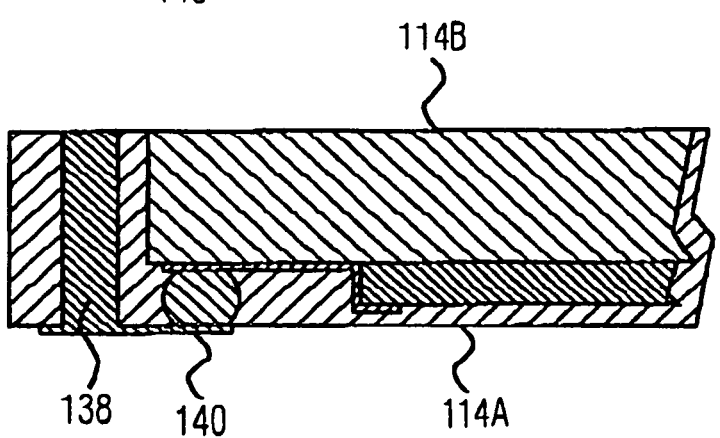

In a subsequent step, the recess 136 is filled with a conductive material so that a pass-through conductor 138 is created, as it is illustrated in FIG. 12b. The pass-through conductor 138 comprises an electrical contact with a redistribution structure 140 formed on the surface 114a. Thereby a redistribution may be achieved, wherein the pass-through conductor 138 enables connection on both main surfaces of the chip unit, i.e. on the main surface 114a as well as on the main surface 114b.

Figure 12C:
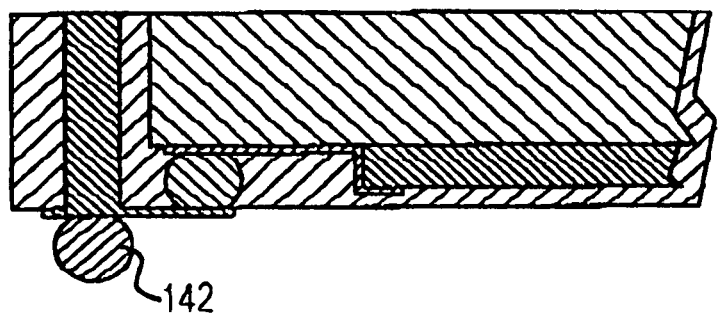

After creating the pass-through conductor 138, the connection contact 142 is applied on the pass-through conductor 128 and/or the redistribution structure 140. The connection contact 142 may for example be a bump, as it is shown in FIG. 12c.

Alternative to the above-described method, the via may also be made, for example, by casting or molding around pins or wires when injection molding.

The vias enable the construction of a stackable system of multiple levels or sheets of encapsulated packages so that an electric contact from one level of packages to the next level of packages is enabled by the vias.

Figure 12D:
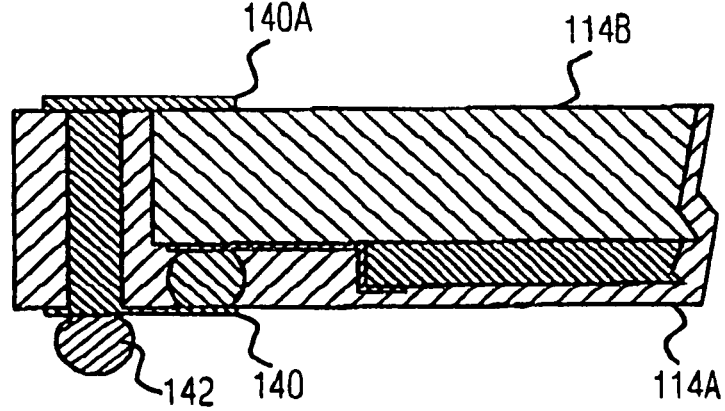

According to FIG. 12d, after creating the redistribution structure 140 on the surface 114a, another redistribution structure 140a extending on the encapsulated mass, across the path conductor 138, and partly on the surface of the chip is formed on a surface 114b of the encapsulated chip, which opposes the surface 114a. For example, the additional redistribution structure 140a enables that an electrical contact between stacked chips can be made, such as by means of a contact bump, when stacking the encapsulated chips.

Figure 13:
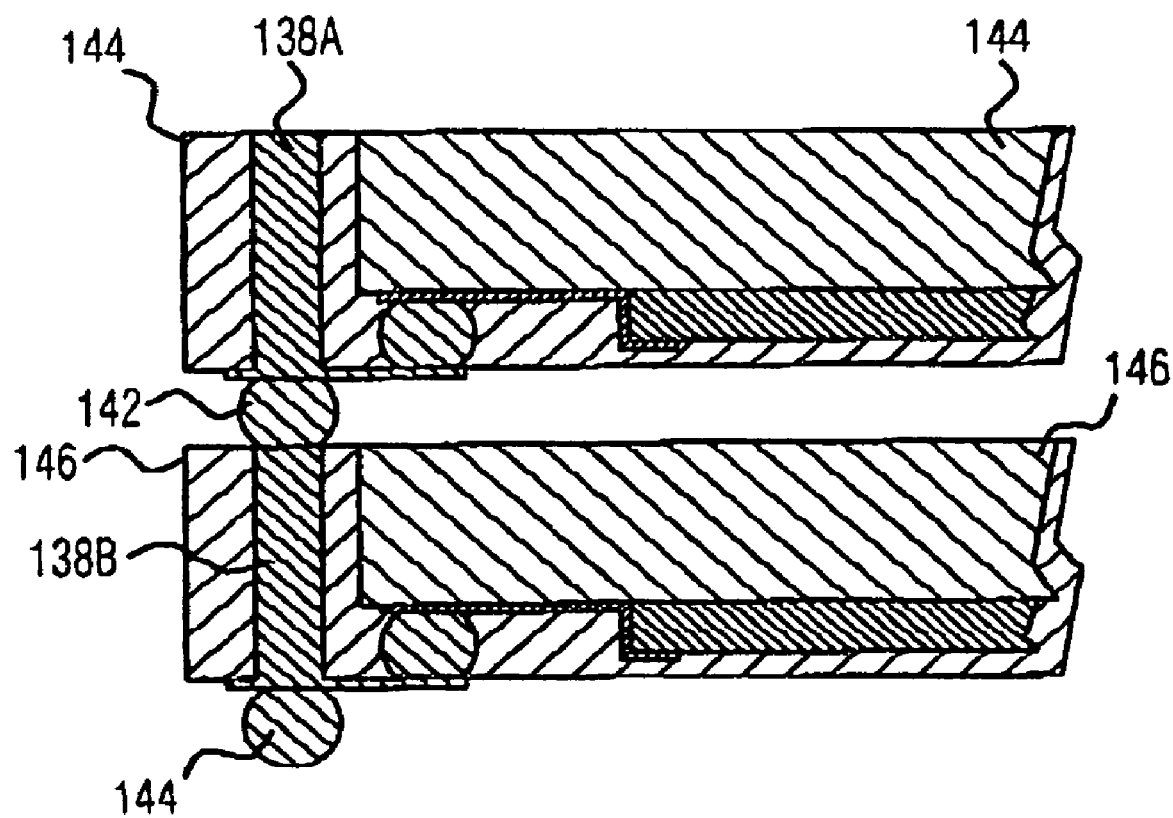
FIG. 13 are a cross-sectional view of a stack of encapsulated chips according to one embodiment of the present invention.

FIG. 13 shows an embodiment of a chip stack of several chip units stacked on top of each other. According to FIG. 13, a first encapsulated chip unit 144 and a second encapsulated chip unit 146 are created according to the described methods, each of the chip units 144 and 146 comprising a pass-through conductor 138a and 138b, respectively, as it has been explained with reference to FIGS. 12a–c. When the respective chip units are stacked on top of each other so that the pass-through conductors 138a and 138b are electrically connected to each other via a connection contact 142 disposed between the pass-through conductors. The stacking of the encapsulated chips or packages may take place in the state in which the respective chips are combined to one unit after the injection molding via the encapsulation material. In this embodiment, the stacked chips 144 and 146 are diced after stacking the chips mechanically combined to one unit.

What is claimed is:

1. A method for producing encapsulated chips, comprising:
   preparing wafer with contacts projecting from a surface of the wafer;
   arranging the wafer on a dicing substrate;
   dicing the wafer to generate a plurality of chips spaced from each other via trenches on the dicing substrate;
   covering the contacts with a protection arrangement;
   subsequently conducting injection molding to introduce an encapsulation material between the contacts and into the trenches, whereby the chips arranged on the dicing substrate are encapsulated;
   subsequently removing the protection arrangement; and
   creating a redistribution structure of an electrically conductive material on a portion formed by the encapsulation material.

2. The method of claim 1, wherein the step of injection molding comprises:
   arranging the plurality of chips on the dicing substrate in an injection mold so that a cavity is formed by the protection arrangement and the injection mold; and
   injecting encapsulation material into the cavity formed by the protection arrangement and the injection mold so that the cavity is filled with the encapsulation material.

3. The method of claim 2, wherein the cavity comprises a vacuum prior to conducting injection molding.

4. The method of claim 1, wherein the injection molding is conducted such that the surface of the encapsulation material is flush with the surface of the contacts after injection molding.

5. The method of claim 1, further comprising the step of pressing the protection arrangement onto the contacts.

6. The method of claim 1, wherein the protection arrangement is selected from the group consisting of a film, a delaminable layer applied to the contacts, or a portion of the injection mold.

7. The method of claim 1, wherein the step of dicing further comprises enlarging a distance between the chips on the dicing substrate by means of a treatment of the dicing substrate for enlarging the surface of the dicing substrate.

8. The method of claim 7, wherein the step of enlarging the distance between the chips includes stretching the dicing substrate.

9. The method of claim 1, further comprising the step of producing a redistribution contact projecting from the redistribution structure.

10. The method of claim 1, wherein functional structures are formed in the step of injection molding.

11. The method of claim 10, wherein the functional structure is selected from the group consisting of a recess, a V-notch, and a protrusion.

12. The method of claim 11, wherein the protrusion is formed in the step of injection molding, the method further including the step of applying an electrically conductive layer to the protrusion for forming an electrical contact.

13. The method of claim 10, wherein the functional structure includes an adjustment marking, a structure for assembly assistance, or a structure for arranging an optical guide.

14. The method of claim 1, further comprising the step of creating a via in the encapsulation material.

15. The method of claim 14, wherein the step of creating a via comprises the step of arranging an electrically conductive pin in the trenches so that the pin is lined by the encapsulation material in the step of injection molding.

16. The method of claim 1, wherein another redistribution structure in addition to the one redistribution structure is provided on a second surface of the wafer, which opposes the surface on which the contacts are formed.

17. The method of claim 1, wherein functional units are assembled on the surface of the wafer prior to encapsulating.

18. A method of producing a stack of encapsulated chips, comprising:
   producing first encapsulated chips according to claim 1;
   producing second encapsulated chips according to claim 1; and
   arranging the first encapsulated chips above the second encapsulated chips so that a stack of encapsulated chips is formed.

19. The method of claim 18, further comprising:
   creating a first pass-through conductor in a portion of the first encapsulated chips, which comprises the encapsulation material;
   creating a second pass-through conductor (in a portion of the second encapsulated chips, which comprises the encapsulation material; and
   arranging a connection contact between the first pass-through conductor and the second pass-through conductor, whereby they are electrically connected.

* * * * *